US006549410B1

(12) United States Patent
Cohen

(10) Patent No.: US 6,549,410 B1
(45) Date of Patent: Apr. 15, 2003

(54) HEATSINK MOUNTING SYSTEM

(75) Inventor: Xavier Cohen, Grenoble (FR)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/990,219

(22) Filed: Nov. 20, 2001

(51) Int. Cl.$^7$ .............................. H05K 7/20; H05K 5/00
(52) U.S. Cl. ...................... 361/704; 165/80.3; 165/185; 257/719; 361/710; 361/801; 361/807; 361/758; 174/138 G
(58) Field of Search ............................... 165/80.2, 80.3, 165/185; 174/16.3, 138 G; 257/707, 713, 718–719, 726–727; 361/687, 704, 707, 709–710, 715, 719–721, 735, 742, 744, 753, 758, 770, 790–791, 801, 804, 807, 809–810

(56) References Cited

U.S. PATENT DOCUMENTS

| | | | | |
|---|---|---|---|---|
| 5,548,486 A | * | 8/1996 | Kman et al. ................. | 361/791 |
| 5,999,405 A | * | 12/1999 | Zappacosta et al. ......... | 361/704 |
| 6,084,774 A | * | 7/2000 | Talbot et al. ............... | 361/704 |
| 6,307,747 B1 | * | 10/2001 | Farnsworth et al. ........ | 361/704 |
| 6,331,937 B1 | * | 12/2001 | Bartyzel ..................... | 361/719 |
| 6,384,331 B1 | * | 5/2002 | Ku ............................. | 361/707 |
| 6,392,889 B1 | * | 5/2002 | Lee et al. .................... | 361/704 |

* cited by examiner

*Primary Examiner*—Gregory Thompson

(57) ABSTRACT

The invention relates to a mounting arrangement for a heatsink for cooling a microelectronic device contained within a chassis. The mounting arrangement includes a heatsink, a motherboard incorporating the microelectronic device thereon and securing means adapted to position both the heatsink and the motherboard in a mounting configuration so that the motherboard is held in fixed relation to the chassis and the heatsink is biased in thermal contact with the microelectronic device by means of a biasing means adapted to engage with both the securing means and the heatsink, whereby the weight of the heatsink thereby is substantially supported by the chassis by way of the securing means. The securing devices in a preferred embodiment correspond to pins which pass through the heatsink, through the motherboard, while simultaneously anchoring same to the chassis, and are attached to the chassis. A biasing device is interposed between each pin and the heatsink, so that as the pins are secured, the heatsink is pressed gently against the device. Suitable applications include PCs, servers and other computer architectures.

9 Claims, 1 Drawing Sheet

HEATSINK MOUNTING SYSTEM

TECHNICAL FIELD

The present invention relates to systems for mounting heatsinks in computers. More particularly, although not exclusively, the present invention relates to methods and apparatus for mounting heatsinks in thermal contact with integrated circuits in computer systems. The invention is particularly suitable for use with microelectronic devices which are generally planar in shape and mounted on a circuit board in a way which would otherwise render it difficult to maintain the device in thermal contact with the heatsink in a secure and reliable fashion.

BACKGROUND ART

As a general rule, the reliability and longevity of a semiconductor device is roughly inversely proportional to the square of the junction temperature change. Therefore, an effective increase in the reliability and life of a microelectronic component can be achieved by a relatively small reduction in operating temperature. For high-performance, high value components such as new generation microprocessors this issue may be particularly acute given that the failure and replacement of such a device is usually outside the scope of routine maintenance and abilities which might be expected of a typical PC user. Further, such failures will adversely affect a vendors business as they usually require the return of equipment and extended servicing to say nothing of damaging consumer goodwill and the vendor's credibility.

Modem microprocessor chips produce a significant amount of heat and it has been observed that the power dissipation of such chips has been increasing faster than the ability of available technology to effectively cool them. Excessive component heating can lead to chip failure and, given the inability of most microelectronic devices to dissipate sufficient heat, it is therefore critical to the function of most modem computers that some form of cooling system is provided.

The process of cooling an electronic component is actually comprised of a number of heat exchange steps. For example, for a heatsink in thermal contact with a microprocessor, heat is conducted away from the chip via a thermal conduction path to a heatsink. Heat is then dissipated from the heatsink by means of a fan mounted thereon. Alternatively, or the heatsink can be placed in the path of forced or convective airflow. This airflow radiates the beat away into the surrounding environment thus indirectly cooling the device on which the heatsink is mounted.

A critical part of the thermal conduction pathway is the thermal junction between the microelectronic device itself and the heatsink. However, heatsinks and microelectronic devices have conflicting physical and thermal characteristics which make them difficult to thermally couple. The heatsink is heavy and large and the microelectronic device is generally smooth, small and has a low profile on its circuit board mount.

To optimize their efficiency, heatsinks are uisually fabricated by die casting, or otherwise fabricating, thermally conductive materials into radiators with large surface areas. To increase the surface area and thus their radiative efficiency, the heatsink can include fins, airfoils and other shapes designed to be amenable to forced convection cooling and sufficient to dissipate large quantities of waste heat.

Further, it is necessary to use physically large heatsinks which often dwarf the device and its support hardware. Being heavy and bulky, heatsinks tend to transmit shock and vibration to the device and the circuit board on which it is mounted. Also, in situations where a fan is attached to provide forced cooling high frequency vibration may be transmitted to the circuit board. This mechanical vibration can cause not only failure of the device, its support mechanism or socket, surrounding motherboard structure and electrical connections to other parts of the circuit. Also, attaching a heavy heatsink to the motherboard can take up significant space on the circuit board due to the presence of attachment or mounting points around the microprocessor Another problem is that the often-bulky heatsink is mounted over the microprocessor and bolted to attachment points on the motherboard located around the perimeter of the microprocessor. This can cause problems as motherboards are usually made of fairly thin material and simply attaching a heavy heatsink to a motherboard can result in circuit board flex and breakage. This can be worsened by aligning the motherboard vertically such as in a tower computer configuration. In such an orientation, the weight of the heatsink can cause torsional flexing which can crack the motherboard material, disrupt electrical connections and damage the microprocessor. This point may be particularly problematic as it is common to use a thermal bonding paste to attach the heatsink to the microprocessor. Thus any stresses and vibrations caused by the unsupported weight of the heatsink will be transmitted directly to the microprocessor.

It is therefore an object of the invention to provide for a system for mounting a heatsink to a microelectronic device which prevents or at least reduces the risk of damage or failure of a microelectronic device and/or it's circuit hardware due to vibration, shock and weight induced distortion of the circuit hardware and/or microelectronic device while at the same time ensuring proper thermal conduction between the heatsink and the microelectronic device.

DISCLOSURE OF THE INVENTION

In one aspect the invention provide for a mounting arrangement for a heatsink for cooling a microelectronic device contained within a chassis, the mounting arrangement including:
  a heatsink;
  a motherboard incorporating the microelectronic device thereon; and
  securing means adapted to position both the heatsink and the motherboard in a mounting configuration so that the motherboard is held in fixed relation to the chassis and the heatsink is biased in thermal contact with the microelectronic device by means of a biasing means adapted to engage with both the securing means and the heatsink, whereby the weight of the heatsink thereby is substantially supported by the chassis by way of the securing means.
  In an alternative embodiment, the securing means may be attached indirectly to the chassis by means of an extender, panel or similar.

Preferably the heatsink is biased against the microelectronic device by means of resilient means positioned and adapted so that any relative movement between the securing means and the heatsink is cushioned.

The securing means may be in the form of a plurality of pins, each pin having:
  a chassis engagement thread at a chassis end thereof
  a heatsink engagement means at a heatsink end thereof; and a motherboard engagement section adapted so as to engage the motherboard so that it is held at a fixed separation from the chassis.

The motherboard is preferably held immediately adjacent the chassis or alternatively, the motherboard is held at a fixed distance from the chassis.

Preferably each pin includes an overhanging lip at the heatsink end which is shaped to engage a coil spring, through which the pin penetrates, in such a way that the location of the heatsink in relation to the microelectronic device is kept substantially constant.

The heatsink is preferably mounted on a plate, the plate having a plurality of apertures, each corresponding to a pin, wherein the pins, in the mounting configuration, penetrate the plate and the motherboard and are fixed to the chassis in such a way that the motherboard is held in a fixed position in relation to the chassis, and the plate, while being free to move on the pins, is biased against the microelectronic device by way of the pins while damping relative movement between the chassis and the heatsink.

In a further aspect of the invention there is provided a pin which adapted for securing a heatsink to a microelectronic device, the pin being in the form of an elongate member having a chassis engagement means at a first end, a heatsink engagement means at a second end and an engagement lip at a point between the first and second end, the elongate member and engagement lip adapted so that the pin can pass through and engage the heatsink at the second end and penetrate and engage with an aperture in a motherboard by means of the lip so as to retain the motherboard in fixed relation to the chassis.

Preferably the pin further includes a biasing means located between the heatsink engagement means and when in use, the heatsink so that when the lip engages with the motherboard aperture, the heatsink and motherboard are held at a substantially fixed separation while any movement between the two is damped by the biasing means.

In an alternative embodiment, the pin may be constructed in a plurality of sections.

The biasing means may be a coil spring.

In a preferred embodiment, the heatsink engagement means may comprises an overhanging lip adapted to engage the heatsink by way of compressing the biasing means wherein the biasing means is interposed between the heatsink or heatsink plate and the lip

BRIEF DESCRIPTION OF THE DRAWINGS

The present invention will now be described by way of example only and with reference to the drawings in which.

BEST MODE FOR CARRYING OUT THE INVENTION

Figure 1:
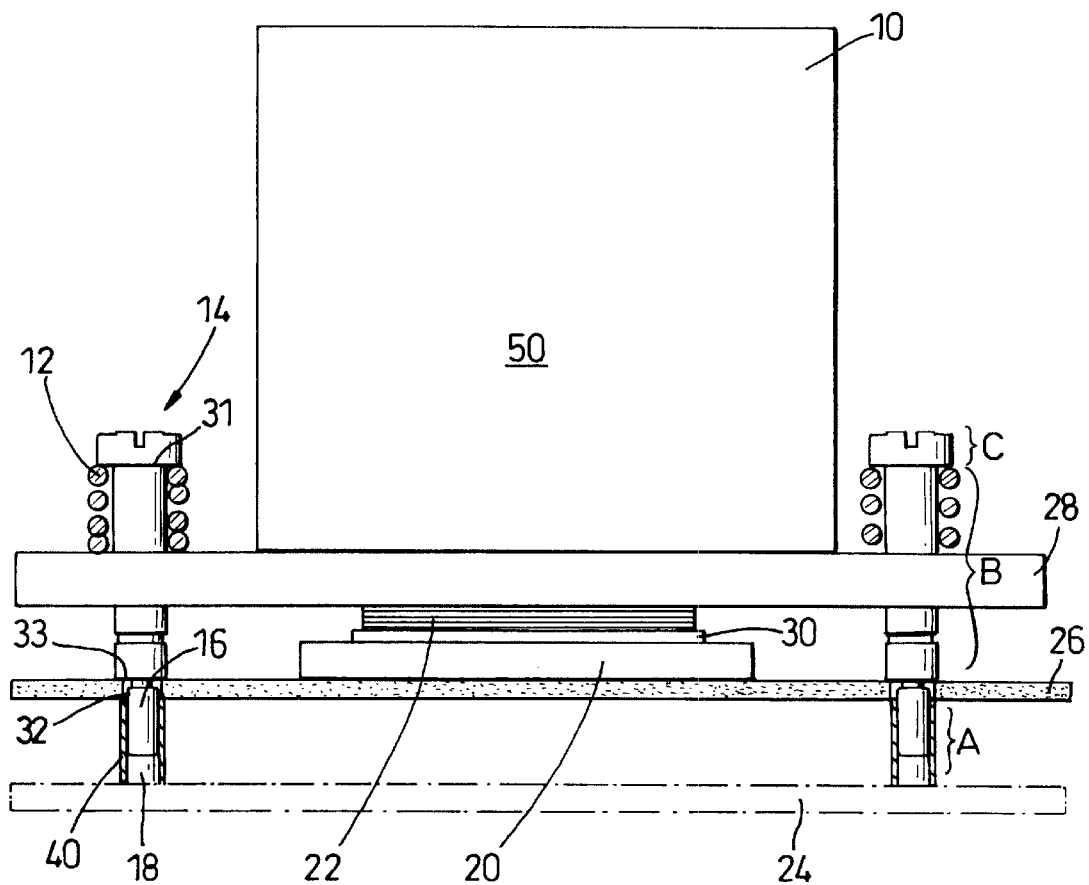
FIG. 1 illustrates a cross-section of a heatsink mounting system mounted in a computer case and chassis.

Referring to FIG. 1, a side view of a mounting arrangement for a heatsink 50 is shown. According to the embodiment illustrated, the heatsink is constructed in the form of a heat exchange device 10 mounted on a plate 28.

A microelectronic device 22, motherboard 26 and other components are contained within a chassis. A portion of the chassis, extension member or panel is indicated by the numeral 24. This is referred to as a chassis member as it may be part of the chassis wall or an extension panel mounted thereon. The microelectronic device is mounted in a socket 20 which is mounted on the motherboard 26 in a known manner.

The mounting arrangement includes securing means which, in the preferred embodiment, correspond to pins 14. These are constructed so as to position both the heatsink 50 and the motherboard 26 so that the motherboard 26 is held in fixed relation to the chassis member 24 while the heatsink is allowed to move along the axis of the pins (up and down in the figure).

To ensure that contact between the heatsink and the microelectronic device is maintained, the heatsink 50 is biased downwardly towards the device 22. The biasing means are constructed and located so as to engage with the upper ends of the pins 14 and the heatsink 50. The chassis member 24 by way of the securing pins 14 substantially supports any sideways components of the stress or vibration caused by the weight of the heatsink 50.

The biasing mechanisms in the example shown corresponds to coil springs 12 which are positioned and shaped so that any relative up and down movement between the chassis member 24 and the heatsink 50 is damped and, when the pins are screwed into the plate, the heatsink 50 is held in contact with the device.

Only two pins are visible in FIG. 1 as the rear pins are obscured by those at the front. Each pin 14 has a chassis engagement thread 18 at the chassis member, or lower, end and a heatsink engagement means at the heatsink, or upper, end. Each pin 14 also has a motherboard engagement section 16 adapted to engage the motherboard 26 and hold it at a fixed elevation above the chassis member 24. To this end, the motherboard 24 can be held immediately adjacent the chassis member 24 or alternatively, and as shown in FIG. 1, at a fixed distance from the chassis member by means of standoffs 40 in the form of sleeves which fit over the lower portion of the pins 14 and support the motherboard.

To engage with the biasing means 12, each pin 14 includes a feature, such as an overhanging lip 31, at the heatsink end of the pin which is shaped to engage the biasing means, in this case, the coil spring 12. In this way, when the pins are screwed into the chassis member, the heatsink 50 is pressed gently against the device 22.

For ease of construction, the heatsink 50 may comprise a heat exchange device mounted on a plate 28. The plate 28 has a plurality of apertures (obscured in the figure) each corresponding to a pin 14. The plate 28, and thus the heatsink 50, while being free to move up and down on the pins 14, is biased against the microelectronic device by way of the coil springs 12.

Each pin 14 is in the form of an elongate member having a chassis member engagement means, or thread 18, at a first end and a heatsink engagement means, or lip 31, at a second end. Each pin 14 also has an engagement lip 33 formed in the engagement section 16 at a point between the first and second end of the pin 14. The engagement lip 33 is shaped so that the pin 14 can pass through and engage the heatsink 50 at the second, or upper, end and penetrate and engage with an aperture 32 in the motherboard 26. This retains the motherboard in fixed relation to the chassis member. Collars or stand-offs 40 are used to hold the motherboard away from the chassis member surface.

The biasing means, or coil spring 12, is located between the heatsink upper lip 31 and the heatsink plate 28. In the mounted configuration, this spring is compressed slightly. It can be seen that the heatsink 50 and motherboard 26 are held at a substantially fixed separation while still allowing for flexing and small displacements between the two along the axis of the pins 14. This construction damps any relative movement between the chassis member 24 and the heatsink 50, and more importantly provides a significantly stronger attachment point for the heatsink than known methods of attaching a heatsink directly to the motherboard. According to the present construction, the chassis member supports the weight of the heatsink by means of the pins thereby reducing the risks of damaging the microelectronic device or the motherboard.

Referring to the specific construction of the pins 14, it is possible that each pin may be constructed in a number of sections or parts. For example, the lower portion may be constructed as a unitary standoff A upon which the motherboard is mounted. Onto the upper end of this section, a spacer B may be fixed, followed by the plate 28, spring and top pin portion C. The top pin portion traps the coil spring thus providing the combined mounting and damping action.

The specific example shown illustrates a large heatsink mounted over a flat microprocessor similar to those found in consumer personal computers. It is possible to implement the invention in other computer architectures such as servers and specialized function devices. Although the present example shows the pins being attached to a chassis member this may be part of the computer chassis itself or a chassis extender panel used to provide a secondary mounting point for the pins 14 in situations where the motherboard is mounted too far from a convenient chassis mounting point. In such a case, the extender panel is in the form of a flat mounting member and is secured to the chassis at a convenient location and the pins 14 attached thereto.

Another possible embodiment is one where the biasing means is in the form of a unitary spring such as a square shaped leaf spring. This might be slid onto the pins as one unit, joined by webs or similar between the operative parts of the spring. Such a construction would prevent loss of the individual coil springs and may possibly provide a more even biasing force across the whole heatsink. It is also to be noted that while a simple heatsink geometry has been discussed and illustrated, others are feasible exhibiting regular or irregular geometries depending on the size and shape of the device and perhaps the space in which the heatsink is to be located.

Although the invention has been described by way of example and with reference to particular embodiments it is to be understood that modification and/or improvements may be made without departing from the scope of the appended claims.

Where in the foregoing description reference has been made to integers or elements having known equivalents, then such equivalents are herein incorporated as if individually set forth.

What is claimed is:

1. A mounting arrangement including:
   a heatsink;
   a motherboard incorporating a microelectronic device thereon; and
   securing means adapted to position both the heatsink and the motherboard in a mounting configuration so that the heatsink is biased in thermal contact with the microelectronic device by means of biasing means adapted to engage with both the securing means and the heatsink, whereby the weight of the heatsink thereby is substantially supported by a chassis member by way of the securing means and wherein the securing means is in the form of a plurality of pins, each pin having a chassis engagement means at a chassis end thereof, a heatsink engagement means at a heatsink end thereof, and a motherboard engagement section adapted so as to engage the motherboard so that it is held at a fixed position in relation to the chassis member.

2. A mounting arrangement as claimed in claim 1 wherein the heatsink is biased against the microelectronic device by means of the biasing means positioned and adapted so that any relative movement between the securing means and the heatsink is cushioned.

3. A mounting arrangement as claimed in claim 1 wherein the motherboard is held immediately adjacent the chassis member.

4. A mounting arrangement as claimed in claim 1 wherein each pin includes an overhanging lip at the heatsink end which is shaped to engage the biasing means, the biasing means in the form of a coil spring, through which the pin penetrates, in such a way that the location of the heatsink in relation to the microelectronic device is kept substantially constant.

5. A mounting arrangement as claimed in claim 1 wherein the heatsink is in the form a heat exchange device mounted on a plate, the plate having a plurality of apertures, each corresponding to a securing means, wherein the securing means, in the mounting configuration, penetrate the plate and the motherboard and are fixed to the chassis member in such a way that the motherboard is held in a fixed position in relation to the chassis member, and the plate, while being free to move on the securing means, is biased against the microelectronic device by way of the securing means while damping relative movement between the chassis member and the heatsink.

6. A pin in the form of an elongate member having a chassis member engagement means at a first end, a heatsink engagement means at a second end and an engagement lip at a point between the first and second end, the elongate member and engagement lip adapted so that the pin can pass through and engage the heatsink at the second end and penetrate and engage with an aperture in a motherboard by means of the lip so as to retain the motherboard in fixed relation to the chassis member wherein the pin further includes a biasing means located between the heatsink engagement means and, when in use, the heatsink so that when the engagement lip engages with the motherboard aperture, the heatsink and motherboard are held at a substantially fixed separation while any movement between the two is damped by the biasing means.

7. A pin as claimed in claim 6 wherein the pin is constructed in a plurality of sections.

8. A pin as claimed in claim 6 wherein the biasing means is a coil spring.

9. A pin as claimed in claim 6 wherein the heatsink engagement means comprises an overhanging lip adapted to engage the heatsink by way of compressing the biasing means wherein the biasing means is interposed between the heatsink and the lip.

* * * * *